(12) United States Patent
Sommer

(10) Patent No.: US 7,872,914 B2
(45) Date of Patent: Jan. 18, 2011

(54) MONITOR STRUCTURE FOR MONITORING A CHANGE OF A MEMORY CONTENT

(75) Inventor: Michael Sommer, Raubling (DE)

(73) Assignee: Infineon Technologies AG, Neubiberg (DE)

( * ) Notice: Subject to any disclaimer, the term of this patent is extended or adjusted under 35 U.S.C. 154(b) by 207 days.

(21) Appl. No.: 12/341,349

(22) Filed: Dec. 22, 2008

(65) Prior Publication Data

US 2010/0157679 A1    Jun. 24, 2010

(51) Int. Cl.
G11C 11/34 (2006.01)
(52) U.S. Cl. .............................. 365/185.05; 365/185.1; 365/185.2
(58) Field of Classification Search ............ 365/185.05, 365/185.1, 185.2
See application file for complete search history.

(56) References Cited

U.S. PATENT DOCUMENTS

| 5,684,739 A | 11/1997 | Takeuchi et al. |
| 5,892,709 A * | 4/1999 | Parris et al. ............ 365/185.01 |
| 6,028,791 A | 2/2000 | Tanaka et al. |
| 7,368,789 B1 * | 5/2008 | Dhaoui et al. ............... 257/369 |
| 7,405,971 B2 * | 7/2008 | Shukuri et al. ......... 365/185.05 |
| 2006/0050586 A1 | 3/2006 | Ohtsuki et al. |

FOREIGN PATENT DOCUMENTS

| JP | 10-228789 A | 8/1998 |
| JP | 2000-293991 A | 10/2000 |

* cited by examiner

*Primary Examiner*—Son Dinh
(74) *Attorney, Agent, or Firm*—Dickstein Shapiro LLP

(57) ABSTRACT

A monitor structure for monitoring a change of a memory content in a memory field of a non-volatile memory comprising a reference transistor in the memory field and a monitor transistor. The monitor transistor and the reference transistor comprise a common floating gate. Moreover, the memory field is arranged in a first well, and the monitor transistor in a second well. The first well and the second well are of different doping types.

25 Claims, 7 Drawing Sheets

700

Applying a voltage to source, drain, the control gate and the well of a reference transistor in the memory field so as to change the memory content of the reference transistor. —710

Determining a monitoring parameter of a monitor transistor is performed, wherein the monitor transistor and the reference transistor comprise a common floating gate, wherein the memory field is arranged in a first well and the monitor transistor is arranged in a second well, wherein the first well and the second well are of different doping types. —720

Evaluating the monitoring parameter. —730

FIG 7

MONITOR STRUCTURE FOR MONITORING A CHANGE OF A MEMORY CONTENT

BACKGROUND

The application relates to a monitor structure and a method for monitoring a change of a memory content in a memory field of a non-volatile memory.

Changing a memory content of a non-volatile memory, for example, may comprise changing the charge on a floating gate of a transistor. A change of a memory content can be a write or an erase operation.

BRIEF DESCRIPTION OF THE DRAWINGS

Exemplary embodiments will be explained in greater detail in the following with reference to the accompanying figures, in which:

FIG. 7 is a flowchart of a method of monitoring a change of memory content in a memory field of a non-volatile memory.

DETAILED DESCRIPTION OF EXEMPLARY EMBODIMENTS

When erasing and writing, or generally changing, memory content of a flash memory (with floating-gate cell) or another non-volatile memory, there are dependencies, such as on the on-chip voltage stability (PSRR, power supply rejection ratio), process variations and temperature variations, which present a technical problem. Independently of the type of programming of the non-volatile memory, be it by "hot carrier" or Fowler-Nordheim, for example, variations in the tunneling rate are the result. If, for example, the temperature is high during erasing or during writing, electrons (and holes) may migrate through a tunnel oxide more easily than at cooler temperature. Process variations may influence the quality of the tunnel oxide, and hence also its tunneling behavior. Voltage variations during the erase process or the write process may influence the transfer of the electrons.

The superimposition of all these factors may cause increased tunnel variance. The safety distance between erased cell and written cell, for example expressed in the difference of the corresponding threshold voltages of the transistors, decreases. If this distance becomes too small or even disappears, no secured readout is possible anymore. The problem also is aggravated, for example, by the fact that both the erased cells and the written cells always have to be brought to the same charge level again after a cycle during repeatedly erasing and writing, respectively. The erase process may always be the same for all cells, but not the writing. In principle, the cells thus are operated unequally.

Due to the higher mobility of the charge carriers for NFET transistors as compared with PFET transistors (p-field effect transistor), almost exclusively all memory fields are constructed with NFET transistors (n-field effect transistor). For example, this results in the fact that the erase process mostly also means that electrons are tunneled out of the floating-gate area. This means that the number of electrons on the floating gate is reduced during an erase process. Thus, a rather positively charged floating gate may develop. The NFET thus has a tendency to open and become conducting. There is the danger of an over-erase, a bit (memory cell) erased too strongly. As a result, great leakage currents may occur, which may render reading the memory (and/or sector) impossible.

Erasing may mostly be not performed bit-individual or memory-cell-individual and therefore mostly has to take place for an entire word line (page) or an entire sector (e.g. 33 word lines). Hence, it is important to avoid high variance or scattering of the erase process and/or write process when erasing, but also when writing the cells.

Figure 1:
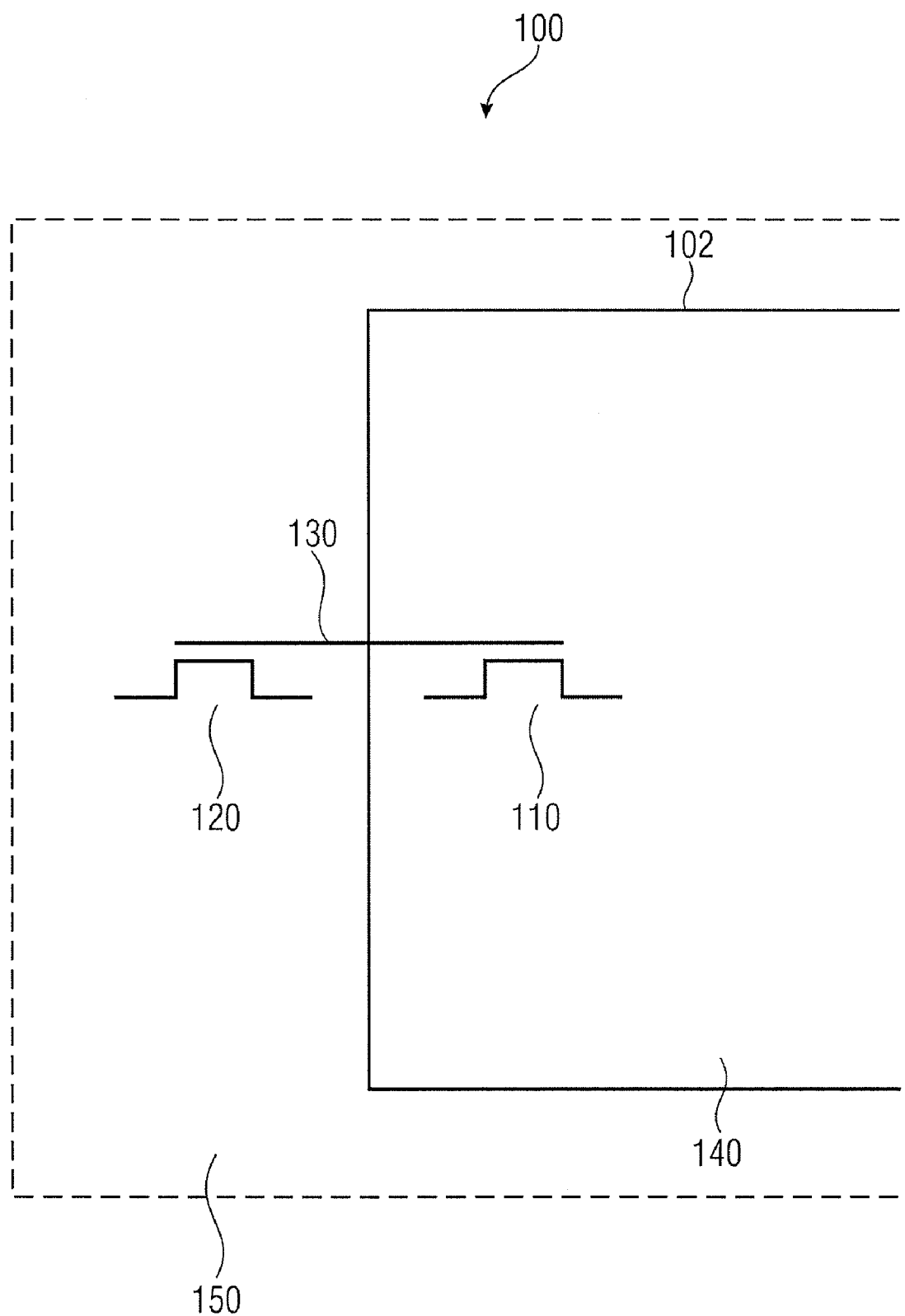
FIG. 1 is a schematic illustration of a monitor structure for monitoring a change of memory content in a memory field of a non-volatile memory.

FIG. 1 shows a schematic illustration of a monitor structure 100 for monitoring a change of memory content in a memory field 102 of a non-volatile memory, corresponding to an exemplary embodiment. The monitor structure 100 comprises a reference transistor 110 in the memory field 102 and a monitor transistor 120, wherein the monitor transistor 120 and the reference transistor 110 comprise a common floating gate 130. The memory field 102 here is arranged in a first well 140 and the monitor transistor 120 in a second well 150, wherein the first well 140 and the second well 150 are of different doping types.

Due to the common floating gate 130, the behavior of the monitor transistor 120 also is influenced by a change of the memory content of the reference transistor 110. For example, due to a change of the memory content of the reference transistor 110, both the threshold voltage of the reference transistor 110 and the threshold voltage of the monitor transistor 120 are shifted. Evaluation e.g. of the threshold voltage of the monitor transistor 120 during the change of the memory content of the reference transistor 110 may be utilized for assessing as to whether for example a write or erase process is completed.

This assessment may be done by comparing the threshold voltage of the monitor transistor 120 with an reference threshold voltage. The reference threshold voltage may be a known value or may be determined, for example, by a calibration of the monitor structure. The current of the monitor transistor may be monitored and evaluated alternatively to the threshold voltage.

Due to the common floating gate of the monitor transistor and the reference transistor, the monitor transistor may follow a change of memory content of the reference transistor. Due to the arrangements of the monitor transistor in a well outside the memory field, the potentials applied to the monitor transistor can be chosen almost independent from the potentials applied to the reference transistor. Thereby, the monitor transistor may be used for monitoring the change of the memory content of the reference transistor.

Due to the different doping type of the first well with the memory field and the second well with the monitor transistor, and hence the different transistor types of the reference transistor and of the monitor transistor, a change of the memory content of the reference transistor, wherein, for example, the threshold voltage of the reference transistor is shifted toward higher voltages, may be monitored by the monitor transistor, in which the threshold voltage is shifted toward smaller voltages. Thus, the reference transistor, which can provide less and less current because of the threshold voltage shift, can be monitored by the monitor transistor, which can provide increasingly more current because of the threshold voltage shift. The higher current can be detected easily.

Voltage variations, process variations and/or temperature variations may for example be compensated by monitoring e.g. the threshold voltage of the monitor transistor 120 and aborting the change of the memory content of the reference transistor 110 (e.g. a write or erase process of the reference transistor) as soon as the desired state has been reached.

By the monitoring of the change of the memory content, erroneous change of the memory content may be minimized and desired memory content thus be stored with high reliability.

In most memory architectures, a control gate is used for several memory transistors. If this so-called word line at the same time also is the control gate of the reference transistor 110, or the same potential as on the word line of the memory transistors is applied to the control gate of the reference transistor 110, a change of the memory content of the memory transistors may be monitored with the monitor structure, which is also denoted as monitor cell.

The monitor structure (monitor cell) may, for example, detect how far the change of the memory content, which is for example a write or an erase process, has proceeded already during a change of the memory content (erasing and/or writing).

For example, one monitor cell each may be used for every word line. It would also be possible to manage with only one or few monitor cells. Below this, however, the reliability and/or the "cycle"-stability of these memory cells could suffer.

A monitor cell may, for example, be arranged at the edge of the memory field, which is also denoted as cell field, because the monitor cell may thus be placed in area-neutral manner (e.g. integrated in dummy structures). In other words, since so-called dummy structures or dummy transistors, which have no functional meaning, are arranged at the edge of the memory field in most memory architectures, these dummy transistors may be structured and used as monitor structures.

At the beginning and at the end of a word line (page) each, at the memory field edge (array edge), the p-doped (or n-doped) first well, which is also denoted as memory cell field well, of the memory field changes to the n-doped (or p-doped) second well, which is also called buried well. The memory transistor (array transistor) here is almost exclusively always an NFET, and the first well of the memory field thus a p-doped well.

For example, if the floating gate of the edge cells is drawn and/or processed over the well edges (of the memory field), PFET transistors are obtained over the second well (n-well). In terms of voltage, these transistors may be switched almost independently of the cell field or memory field. These transistors may thus be used as monitor transistors. Reading out a transistor property, e.g. the threshold voltage, thus also is possible during erasing and/or writing memory transistor (cell). Since the quality of programming during a change of memory content (e.g. erasing and/or the writing) may be monitored by the monitor structure described, process variations, voltage variations and/or temperature variations are detected, and erroneous programming may be avoided.

Figure 2:
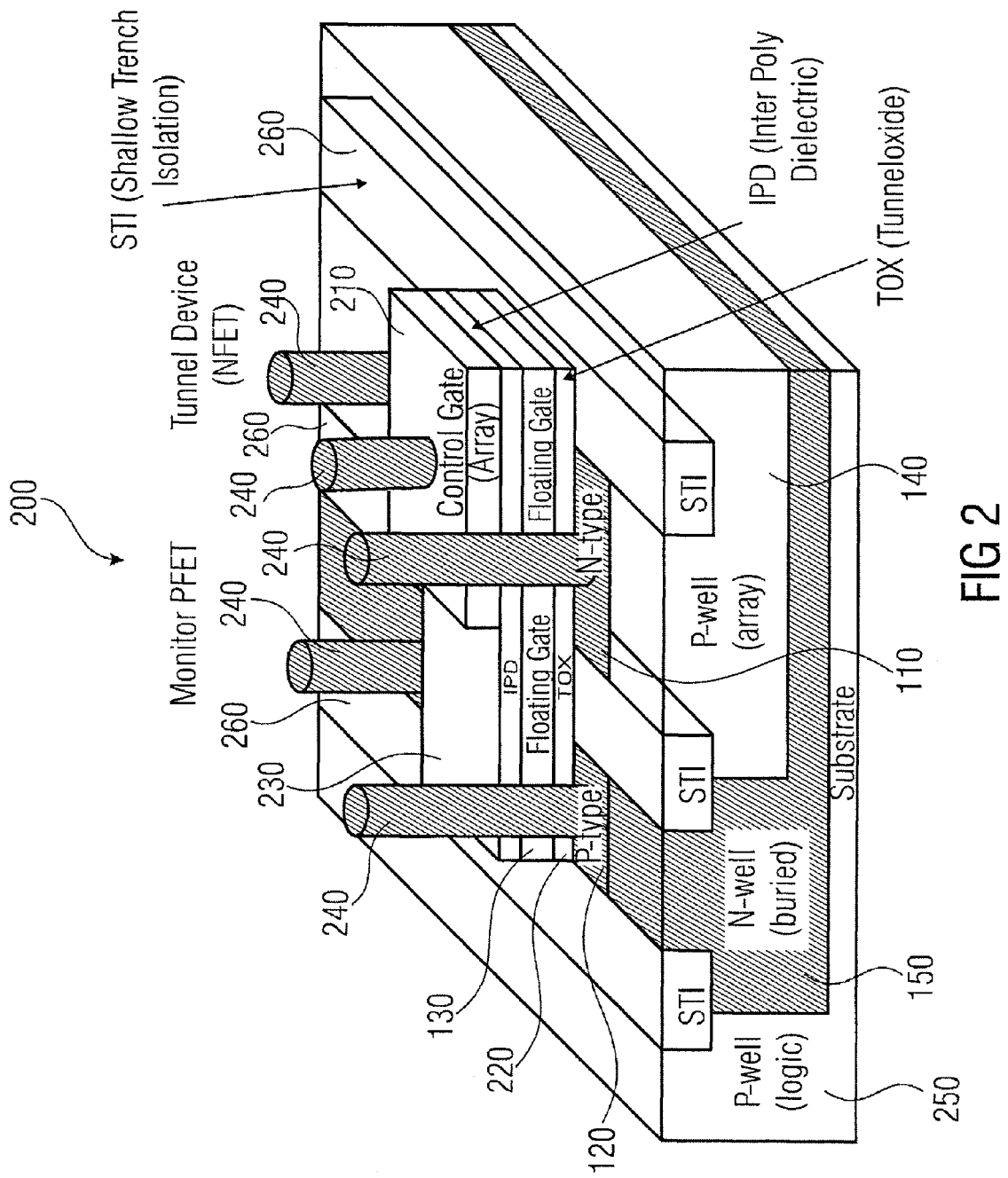
FIG. 2 is a schematic illustration of a construction of a monitor structure.

FIG. 2 shows a schematic illustration of a construction of a monitor structure 200, corresponding to an exemplary embodiment. The schematic illustration shows, in three-dimensional manner, the arrangement of the different wells, the reference transistor 110 (tunnel device NFET), the monitor transistor 120 (monitor PFET), and the gate construction of the reference transistor 110 and of the monitor transistor 120. The reference transistor 110 is arranged in the first well 140 (p well array). The first well 140 is surrounded by the second well 150 (n well array), in which the monitor transistor 120 is arranged. Moreover, the second well 150 is surrounded by a third well 250 (p well logic), which is also denoted as substrate.

The gate construction shows that the tunnel oxide (TOX) 220, the floating gate 130 and the inter poly dielectric 230 (IPD) extend across the monitor transistor 120 and the reference transistor 110. Both transistors thus comprise a common floating gate 130, as described. Moreover, the control gate 210 (array) of the reference transistor 110 also is illustrated.

Here, the transistors are separated from each other by so-called STI (shallow trench isolation) trenches 260. The source and drain regions of the monitor transistor and the reference transistor, as well as the control gate of the reference transistor are connected, via contacts 240, to a wiring plane not shown and lying thereabove.

Figure 3:
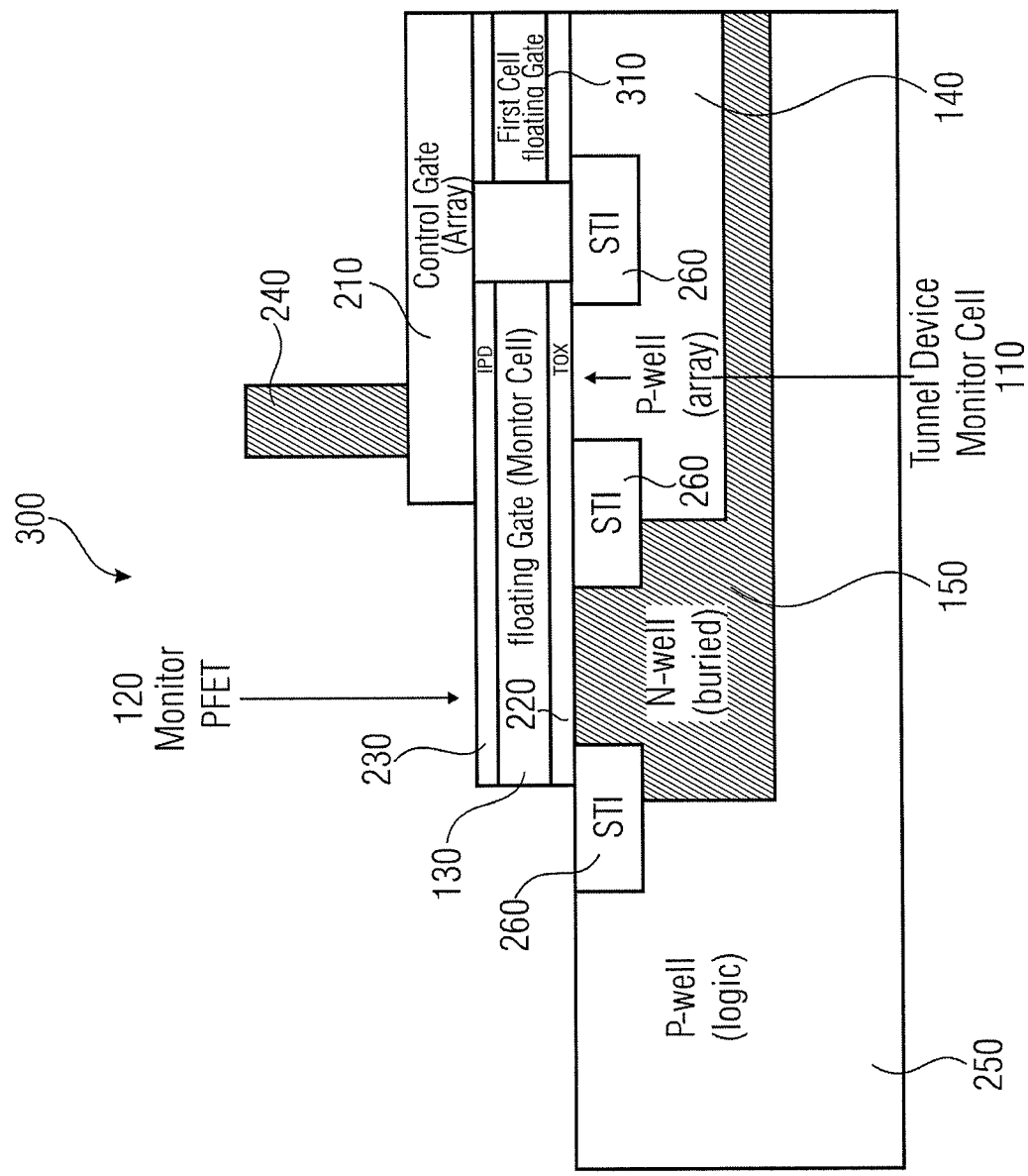
FIG. 3 is a schematic cross-section of a construction of a monitor structure.

Corresponding to FIG. 2, FIG. 3 shows a schematic cross-section 300 of the construction of the monitor structure. Once again, the reference transistor 110 (tunnel device monitor cell) and the monitor transistor 120 (monitor PFET) with their common floating gate 130 (floating gate of the monitor cell) are illustrated.

As an example, it is additionally shown that the control gate 210 (array) of the reference transistor 110 extends across the first memory cell 310 (the floating gate of the first memory cell). Thereby, it may be guaranteed that the same voltage is applied to the control gate 210 of the memory cell 310 (memory transistor) and the reference transistor 110. If a change of the memory content of the memory cell 310 occurs, this change may be followed correspondingly by the reference transistor 110 by applying the same voltage also to source and drain of the reference transistor 110. By the common floating gate 130 of the reference transistor 110 and of the monitor transistor 120 and the possibility of choosing the voltages at the monitor transistor 120 almost independently of the voltages of the reference transistor 110, because the monitor transistor 120 is arranged in another well, the change of the memory content of the memory cell 310 can be monitored by the monitor transistor 120.

If the control gate 210 runs across several memory cells, these memory cells can be monitored by the monitor structure described. Most memory architectures use a common control gate, which is also denoted as word line, for several memory cells. By arrangement of a monitor structure for example on the edge of the memory field at the end of the common control gate (word line), monitoring a change of the memory content can be performed without great effort. For example, the dummy structures or dummy transistors, which mostly are located at the edge of memory fields, may also be used for the monitor structure. Thereby, no further area is required for the monitor structure.

Monitor structures may be arranged e.g. at the end of each word line so as to be able to monitor the entire memory field. Here, it is not absolutely necessary for the word line (common control gate) of the memory cells to form the control gate of the reference transistor 110 as well. For example, it is also possible to connect the control gate of the reference transistor directly to the word line via a wiring plane. However, it is to be taken care, that a voltage on the word line is as equal as possible to a voltage on the control gate of the reference transistor.

Figure 4:
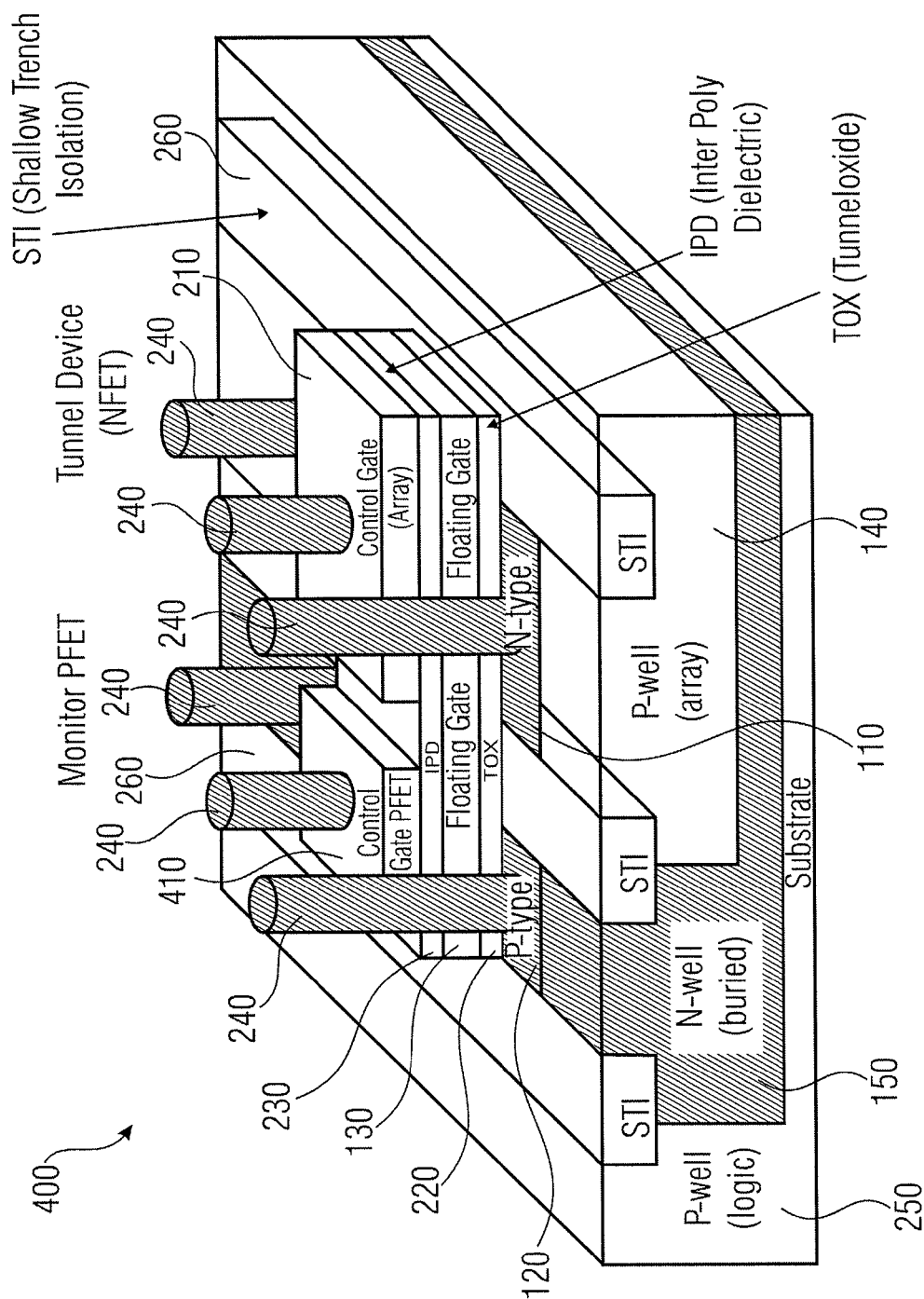
FIG. 4 is a schematic illustration of a monitor structure.

FIG. 4 shows a schematic illustration of a monitor structure 400 corresponding to an exemplary embodiment. The monitor structure 400 here is similar to the monitor structure shown in FIG. 2. But here the monitor transistor 120 also comprises a control gate 410. Due to the control gate 410 of the monitor transistor 120, determining a monitoring parameter, such as a current or the threshold voltage of the monitor transistor 110, may be simplified. For example, the voltage at the control gate 410 of the monitor transistor 120 can be changed if the monitor transistor 110 closes and the current becomes small and therefore more difficult to detect.

Due to the additional contact and the correspondingly necessary wiring for the control gate of the monitor transistor 120, slightly more space possibly will be required than by the monitor structure described in FIG. 2. Hence, depending on the demand, the space-saving variant shown in FIG. 2 or the somewhat more flexible variant shown in FIG. 4 can be chosen.

The additional control gate (of the monitor transistor), by correspondingly impressing the control-gate voltage, allows for making monitor transistor (PFET transistor) conduct (or close) sooner or later. In this manner, e.g. more independence from the doping used in the second well (buried well) may be gained.

Figure 5:
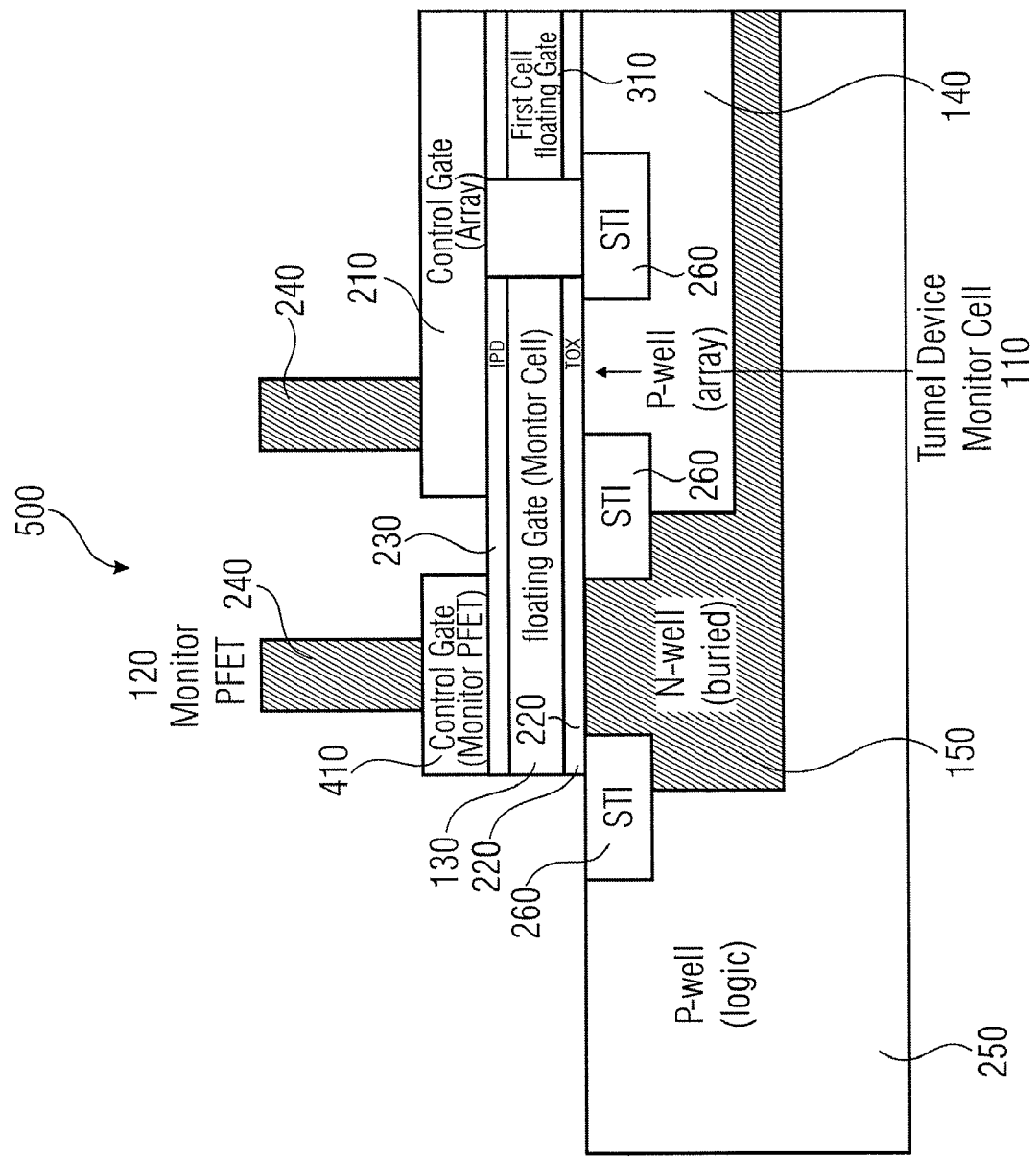
FIG. 5 is a schematic cross-section of a monitor structure.

Corresponding to FIG. 4, FIG. 5 shows a schematic cross-section 500 of the construction of the monitor structure. Like in FIG. 3, optionally a common control gate 210 of the reference transistor 110 with a memory cell 310 is illustrated.

Figure 6:
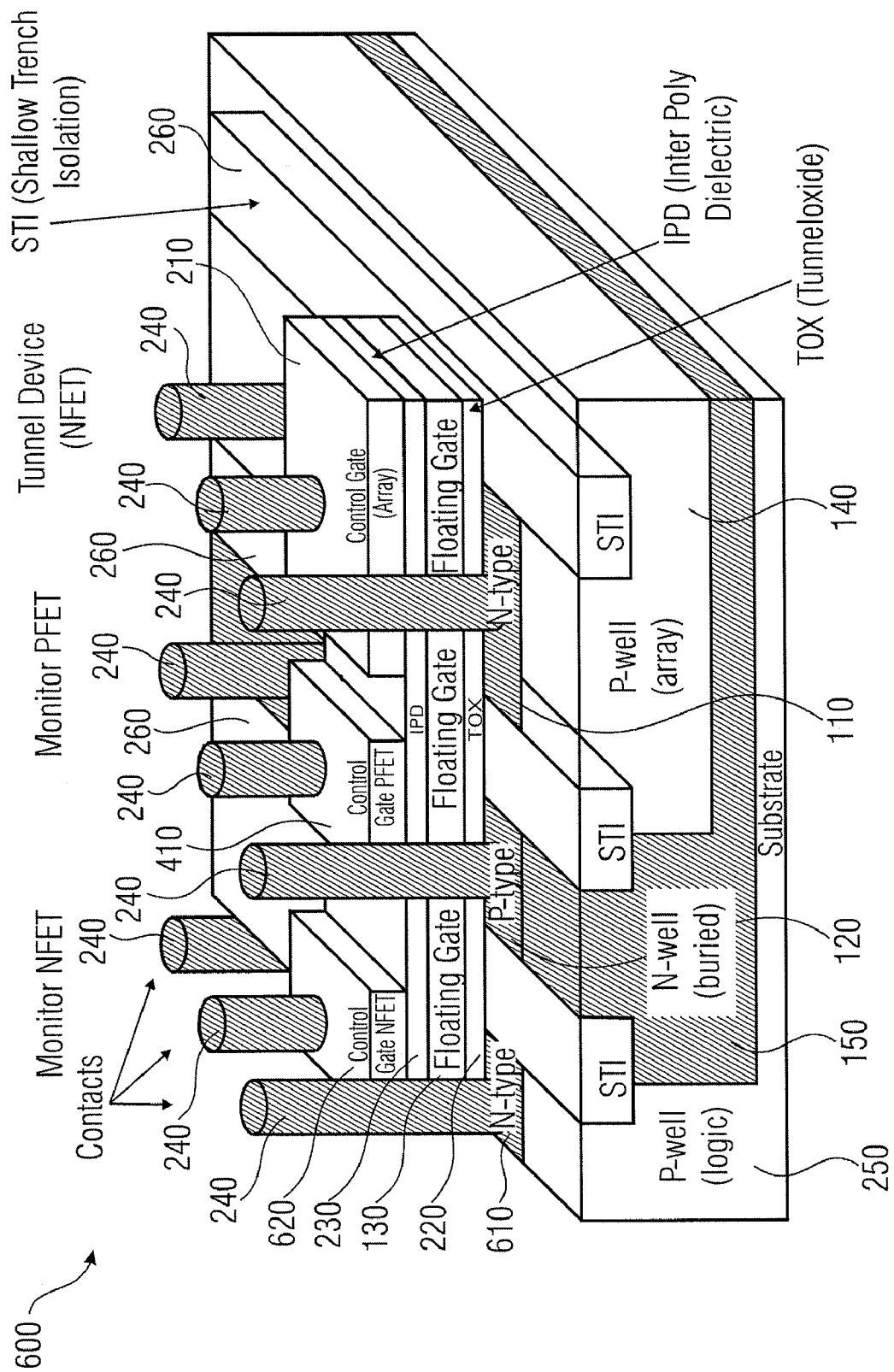
FIG. 6 is a schematic illustration of a monitor structure.

FIG. 6 shows a schematic illustration of a monitor structure 600, corresponding to an exemplary embodiment. The construction of the reference transistor 110 and of the first monitor transistor 120 here corresponds to the monitor structure shown in FIG. 4. In addition, the monitor structure 600, however, comprises a second monitor transistor 610 (monitor NFET), which is arranged in the third well 250 (p well logic). Here, the reference transistor, the first monitor transistor 120 and the second monitor transistor 610 comprise a common floating gate 130.

In this example, both the first monitor transistor 120 and the second monitor transistor 610 comprise a control gate 410, 620. These control gates are optional and may be omitted depending on the demand to save space, as already described in FIG. 4.

Since the first well 140 and the third well 250 are of the same doping type, the reference transistor 110 and the second monitor transistor 610 are of the same transistor type.

Upon a change of the memory content of the reference transistor 110, a shift of the threshold voltage occurs. By the common floating gate 130, the threshold voltage of the first monitor transistor 120 and of the second monitor transistor 610 also is shifted correspondingly. Since the first monitor transistor 120 and the second monitor transistor 610 are of different transistor types, this leads to an increasing current of one of the two monitor transistors 120, 610 and to a decreasing current at the other one, depending on the type of the change of the memory content of the reference transistor 110 and, connected thereto, a change of the charge on the common floating gate 130. Since higher currents can be detected more easily than small currents, that monitor transistor comprising an increasing current during the change of the memory content may be used for monitoring the change of the memory content.

If the control gate 210 of the reference transistor 110, as described in FIG. 3, is the end of a word line of several memory cells, one of the two monitor transistors may be arranged with a second reference transistor at the other end of the word line as an alternative to the construction shown in FIG. 6 if the word line extends across the entire memory field.

FIG. 7 shows a flowchart of a method 700 for monitoring a change of memory content in a memory field of a non-volatile memory, corresponding to an exemplary embodiment. Here, at first applying 710 a voltage to source, drain, the control gate and the well of a reference transistor in the memory field is performed so as to change the memory content of the reference transistor. Thereafter, a determination 720 of a monitoring parameter of a monitor transistor is performed, wherein the monitor transistor and the reference transistor comprise a common floating gate. The memory field here is arranged in a first well, and the monitor transistor is arranged in a second well, wherein the first well and the second well are of different doping types. Then, an evaluation 730 of the monitoring parameter is performed.

The evaluation 730 of the monitoring parameter may be based on a comparison of the monitoring parameter with a reference parameter. The monitoring parameter may be the threshold voltage or the current of the monitor transistor and the reference parameter may be a known current or threshold voltage or may be determined by a calibration.

Some exemplary embodiments relate to a method of monitoring a change of memory content in a memory field of a non-volatile memory. Here, at first applying a voltage to source, drain, the control gate and the well of a memory transistor in the memory field is performed so as to change the memory content of the memory transistor, as well as applying voltages to source, drain and the control gate of a reference transistor in the memory field based on the voltages applied to source, drain and the control gate of the memory transistor. Thereafter, a determination of a monitoring parameter of a monitor transistor is performed, wherein the monitor transistor and the reference transistor comprise a common floating gate. The memory field here is arranged in a first well, and the monitor transistor is arranged in a second well, wherein the first well and the second well are of different doping types. Then, an evaluation of the monitoring parameter is performed.

By applying voltages to the memory transistor and associated voltages to the reference transistor, the change of the memory content of the memory transistor (memory cell) is coupled to a change of the memory content of the reference transistor. Due to the common floating gate of the reference transistor and of the monitor transistor, for example, the change of the memory content may be monitored by the monitor transistor during the change.

Here, it is important that the voltages are applied as simultaneous as possible and for the same duration.

Applying the voltages to the reference transistor and to the memory transistor as simultaneous as possible, means that the time difference between applying the voltage to the reference transistor and applying the voltage to the memory transistor is to be no more than 10% of the duration of the change of the memory content.

Applying the voltages to the reference transistor and to the memory transistor for the same duration, if possible, means that the time duration during which the voltage is present at the memory transistor is not to deviate from the time duration the voltage is applied to the reference transistor by more than 10%.

The evaluation of the monitoring parameter may e.g. be used to abort the change of the memory content as soon as a desired memory state has been reached.

For example, if a monitor structure, as shown in FIG. 6, is used, a monitoring parameter may be determined by both monitor transistors. For example, the monitoring parameter belonging to the monitor transistor capable of supplying an increasing current during the change of the memory content may then be used as a criterion as to when the change of the memory content is completed.

In some exemplary embodiments, the voltages applied to source, drain and the control gate of a reference transistor are the same as the voltages applied to source, drain and the control gate of the memory transistor.

Here, it is important that not only voltages as equal as possible are applied to the reference transistor and the memory transistor, but again also that the voltages are applied as simultaneous as possible and for the same duration.

Voltages as equal as possible here means that the voltage at a contact of the memory transistor (e.g. drain) is not to deviate from the voltage at the corresponding contact of the reference transistor by more than 10%.

Some exemplary embodiments are configured to provide a monitor structure and a method for monitoring a change of a memory content in a memory field of a non-volatile memory, in order to store a desired memory content in the memory field with high reliability.

Some exemplary embodiments include a second monitor transistor, wherein the second monitor transistor is arranged in a third well. Here, the first well and the third well are of the same doping type. Thereby, for example, depending on the type of the change of the memory content, that monitor transistor can be employed for monitoring the change of the memory content in which, during the change of the memory content, the threshold voltage is changed so that more current can be provided from that monitor transistor.

Some exemplary embodiments provide a method for monitoring a change of memory content in a memory field of a non-volatile memory, wherein at first applying a voltage to source, drain, control gate and the well of a reference transistor in the memory field is performed so as to change the memory content of the reference transistor. Thereafter, determination of a monitoring parameter of a monitor transistor is performed, wherein the monitor transistor and the reference transistor comprise a common floating gate, and the memory field is arranged in a first well, and the monitor transistor in a second well. The first well and the second well here are of different doping types. Then, evaluation of the monitoring parameter is performed.

Some exemplary embodiments relate to an erase and write regulation of a flash memory depending on process, temperature and voltage variations.

Some exemplary embodiments relate to an integrated two-transistor monitor cell (two-transistor monitor structure).

In some exemplary embodiments, the monitor cell or monitor structure already may detect during erasing (and writing) how far the erase process (or the write process) has proceeded.

In some further exemplary embodiments, each word line includes one monitor cell (monitor structure) each for the erased state and one for the completely written state (in multi-level cells). Alternatively, the use of only one or a few monitor cells (monitor structures) would also be possible. But problems regarding the reliability or "cycle"-stability of these monitor cells (monitor structures) could arise thereby.

In some exemplary embodiments, a monitor structure is arranged at the edge of the cell field (memory field). The monitor cell (monitor structure) may thus be placed in area-neutral manner (for example integrated in the dummy structures).

In some further exemplary embodiments, the p-doped memory cell field well (first well) (because the array transistor or memory transistor almost exclusively always is an NFET) changes to an n-doped buried well (second well) at the beginning and at the end of a page (word line), at the array edge (memory field edge) each, in order to finally change to the "normal" p-doped NFET (logic) well (third well). If the floating gate of the edge cells (memory transistors on the edge of the memory field) is drawn and/or processed over the well edges, PFET transistors are obtained over the n-well (second well), and NFET transistors in the logic p-well (third well). In terms of voltage, these transistors may be switched almost independently of the cell field (memory field). Reading out these transistor properties, e.g. their threshold voltages, thus also is possible during erasing the cells. This may be utilized for process variations, voltage variations and temperature variations. No matter whether at high temperature, when many electrons pass the tunnel oxide, or at low temperature, when tunneling is made more difficult, the comparison with a reference transistor allows for detecting the right time of erasing (to abort erasing), for example.

In some exemplary embodiments, a comparison between the two monitor cells (monitor structures, erased vs. written) may guarantee for harmonic handling of auxiliary and/or intermediate steps, such as "Tiny-Prog", "Write-all" or "Gate Disturb". The on-line readout of the tunnel activity (readout of the monitor transistor) during the change of the memory content also is of use for writing.

In some exemplary embodiments, the quality of the programming (the change of memory content) may be monitored during erasing and/or writing and process variations, voltage variations and temperature variations thus be detected immediately and erroneous programming (change of memory content) be avoided.

In some exemplary embodiments, the monitor cell (monitor structure) comprises a coupling between two different transistors (different wells) via a common floating gate. Programming and erase processes in the cell field (memory field) of a floating-gate cell may thus for example be monitored on-line and ended in time. Thus, process variations, programming and supply voltage variations, as well as temperature variations may be compensated for without time consuming read operations.

Some exemplary embodiments comprise an evaluating unit which assesses, based on a monitoring parameter of a monitor transistor, when a change of memory content (e.g. an erase or write process) can be completed or is completed.

In some exemplary embodiments the monitor transistor may be a depletion device. A depletion device, for example, is a transistor which operates in a depletion mode.

Some further exemplary embodiments relate to a multi-level memory cell. A multi-level memory cell may store more than one bit of information with one memory transistor. To this end, the multi-level memory cell must be able to distinguishably take on more than two defined states. By the use of a monitor structure, during a change of the memory content in a multi-level memory cell, it may be monitored when the desired state is reached.

In some exemplary embodiments, the number of the contacts of the monitor structure is minimized, because for example the monitor structure does not have a control gate. Additionally, the existing dummy structures and the existing distance (the insulation) of the third well (logic well) and the first well (field well) may be used to form or arrange the monitor transistor. It develops in area-neutral manner.

Some exemplary embodiments comprise a calibration of the monitor structure. Here, for example, it is determined what current a monitor transistor provides if the accompanying reference transistor, or a memory transistor coupled to the reference transistor e.g. via a common control gate, is in a written or erased state (or in one of the further states in multi-level memory cells). The current values determined are stored and may later be used for comparison with the monitoring parameter. By way of this comparison, for example, an evaluating unit may determine, during a change of memory content, when a monitoring parameter or a value determined from the monitoring parameter has reached the stored value, and may end the change of the memory content based on this information, because the desired state has been reached.

In some exemplary embodiments the reference device is larger than an memory transistor of the memory field. With larger reference transistors coupling in may be easier. The difference of size between the reference transistor and the memory transistor may be compensated by a calibration.

In some exemplary embodiments the monitor structure may be characterized and calibrated. Changes in temperature, voltage or frequency may lead to a delta deviation or offset. The erase or program time may be extended.

In general, it is to be noted that in some embodiments the reference transistor, and may be a memory transistor, is described as NFET or n-type transistor and the monitor transistor as PFET or p-type transistor, because memory fields are almost always based on NFET transistors. Likewise, however, the reference transistor and the memory transistor may be a PFET and the monitor transistor a NFET, for example.

Furthermore, it is to be noted that the doping type of a well refers to the basic doping of the well, which may either be n-doped or p-doped. Generally, PFETs or p-type transistors are produced and/or arranged in an n-doped well, and NFETs or n-type transistors in a p-doped well. If two wells comprise a different doping type, the basic doping of one of the two wells is a p-doping, and an n-doping of the other well. Wells with the same doping type all either comprise n-basic doping or p-basic doping.

In the present application, the same reference numerals are used for objects and functional units having the same or similar functional properties.

Although some claims only relate to one other claim, also a combination with further claims can be possible.

In particular, it is pointed out that, depending on the conditions, the inventive scheme may also be implemented in software. The implementation may be on a digital storage medium, particularly a floppy disk or a CD with electronically readable control signals capable of cooperating with a programmable computer system so that the corresponding method is executed. In general, the exemplary embodiments thus also consists in a computer program product with a program code stored on a machine-readable carrier for performing the inventive method, when the computer program product is executed on a computer. Stated in other words, the exemplary embodiments may thus also be realized as a computer program with a program code for performing the method, when the computer program product is executed on a computer.

The invention claimed is:

1. A monitor structure for monitoring a change of a memory content in a memory field of a non-volatile memory, comprising:
   a reference transistor in the memory field; and
   a monitor transistor, wherein the monitor transistor and the reference transistor comprise a common floating gate, wherein the memory field is arranged in a first well, and the monitor transistor is arranged in a second well, wherein the first well and the second well are of different doping types.

2. The monitor structure according to claim 1, comprising a second monitor transistor in a third well, wherein the first well and the third well are of the same doping type, and wherein the second well is arranged between the first well and the third well.

3. The monitor structure according to claim 2, wherein the second monitor transistor and the first monitor transistor comprise a common floating gate.

4. The monitor structure according to claim 2, wherein the second monitor transistor and a second reference transistor comprise a common floating gate.

5. The monitor structure according to claim 4, wherein the first reference transistor and the second reference transistor comprise a common control gate.

6. The monitor structure according to claim 1, wherein the reference transistor and a memory transistor in the memory field comprise a common control gate.

7. The monitor structure according to claim 1, wherein the monitor transistor does not comprise a control gate.

8. The monitor structure according to claim 1, wherein the reference transistor is arranged on an edge of the memory field.

9. The monitor structure according to claim 1, comprising an evaluating unit, wherein the evaluating unit is configured to assess a monitoring parameter of the monitor transistor.

10. The monitor structure according to claim 9, wherein the evaluating unit is configured to end the change of the memory content based on the assessment of the monitoring parameter of the monitor transistor.

11. A monitor structure for monitoring a change of a memory content in a memory field of a non-volatile memory, comprising:
    a reference transistor in the memory field;
    a first monitor transistor, wherein the first monitor transistor and the reference transistor comprise a common floating gate, wherein the memory field is arranged in a first well, and wherein the first monitor transistor is arranged in a second well, wherein the first well and the second well are of different doping types; and
    a second monitor transistor, wherein the second monitor transistor and the reference transistor comprise a common floating gate, wherein the second monitor transistor is arranged in a third well, wherein the first well and the third well are of the same doping type, and wherein the second well is arranged between the first well and the third well.

12. A method for monitoring a change of a memory content in a memory field of a non-volatile memory, comprising:
    applying a voltage to source, drain, control gate, and well of a reference transistor in the memory field so as to change the memory content of the reference transistor;
    determining a monitoring parameter of a monitor transistor, wherein the monitor transistor and the reference transistor comprise a common floating gate, wherein the memory field is arranged in a first well and the monitor transistor is arranged in a second well, wherein the first well and the second well are of different doping types; and
    evaluating the monitoring parameter.

13. The method for monitoring a change of a memory content according to claim 12, wherein the monitoring parameter is used as a criterion to assess whether the change of the memory content is completed.

14. The method for monitoring a change of a memory content according to claim 12, wherein the change of the memory content is ended based on the evaluation of the monitoring parameter.

15. The method for monitoring a change of a memory content according to claim 12, wherein the determination of the monitoring parameter of the monitor transistor takes place during the change of the memory content.

16. The method for monitoring a change of a memory content according to claim 13, wherein, depending on the type of the change of the memory content, the monitoring parameter of the monitor transistor or a second monitoring parameter of a second monitor transistor is used as a criterion to assess whether the change of the memory content is completed, wherein the second monitor transistor is arranged in a third well, wherein the first well and the third well are of the same doping type, and wherein the second well is arranged between the first well and the third well.

17. The method for monitoring a change of a memory content according to claim 16, wherein the monitoring parameter of the monitor transistor providing increasing current during the change of the memory content is used as a criterion.

18. The method for monitoring a change of a memory content according to claim 12, wherein the evaluation of the monitoring parameter is based on a comparison of the monitoring parameter with a reference parameter.

19. A method for monitoring a change of a memory content in a memory field of a non-volatile memory, comprising:
   applying a voltage to source, drain, control gate, and well of a memory transistor in the memory field so as to change the memory content of the memory transistor;
   applying a voltage to source, drain, and control gate of a reference transistor in the memory field based on the voltages applied to the source, the drain, and the control gate of the memory transistor;
   determining a monitoring parameter of a monitor transistor, wherein the monitor transistor and the reference transistor comprise a common floating gate, wherein the memory field is arranged in a first well, and wherein the monitor transistor is arranged in a second well, wherein the first well and the second well are of different doping types; and
   evaluating the monitoring parameter.

20. The method for monitoring a change of a memory content according to claim 19, wherein the voltages applied to the source, the drain, and the control gate of the reference transistor in the memory field are the same as the voltages applied to the source, the drain, and the control gate of the memory transistor.

21. A method for monitoring a change of a memory content in a memory field of a non-volatile memory, comprising:
   applying a voltage to source, drain, control gate and well of a memory transistor in the memory field so as to change the memory content of the memory transistor;
   applying a voltage to source, drain, and control gate of a reference transistor in the memory field based on the voltages applied to the source, the drain, and the control gate of the memory transistor;
   selecting a first monitor transistor or a second monitor transistor, wherein the first monitor transistor, the second monitor transistor, and the reference transistor comprise a common floating gate, wherein the memory field is arranged in a first well, the first monitor transistor is arranged in a second well, and the second monitor transistor is arranged in a third well, wherein the first well and the second well are of different doping types, and wherein the first well and the third well are of the same doping type, wherein the second well is arranged between the first well and the third well;
   determining a monitoring parameter of the selected monitor transistor; and
   evaluating the monitoring parameter.

22. The method for monitoring a change of a memory content according to claim 21, wherein the monitor transistor providing increasing current during the change of the memory content is selected.

23. The method for monitoring a change of a memory content according to claim 21, wherein the determination of the monitoring parameter of the selected monitor transistor takes place during the change of the memory content.

24. The method for monitoring a change of a memory content according to claim 21, wherein the change of the memory content is ended based on the evaluation of the monitoring parameter.

25. A computer program product with a program code for performing a method according to claim 12, when the computer program is executed on a computer or microcontroller.

* * * * *